United States Patent
Yeh

(10) Patent No.: US 9,778,777 B2
(45) Date of Patent: Oct. 3, 2017

(54) ELECTROMAGNETIC INPUT DEVICE AND COIL DETECTION CIRCUIT THEREOF

(71) Applicant: Wacom Co., Ltd., Saitama (JP)

(72) Inventor: Chia-Jui Yeh, Hsinchu County (TW)

(73) Assignee: Wacom Co., Ltd., Saitama (JP)

( * ) Notice: Subject to any disclaimer, the term of this patent is extended or adjusted under 35 U.S.C. 154(b) by 357 days.

(21) Appl. No.: 14/066,314

(22) Filed: Oct. 29, 2013

(65) Prior Publication Data
US 2015/0015268 A1    Jan. 15, 2015

(30) Foreign Application Priority Data
Jul. 10, 2013    (TW) .............................. 102124714 A

(51) Int. Cl.
G06F 3/041    (2006.01)
G06F 3/046    (2006.01)
G01R 27/26    (2006.01)

(52) U.S. Cl.
CPC .......... *G06F 3/0416* (2013.01); *G01R 27/267* (2013.01); *G06F 3/046* (2013.01); *G05B 2219/37289* (2013.01)

(58) Field of Classification Search
CPC .................. G06F 3/0416; G06F 3/046; G05B 2219/37277; G05B 2219/37289; G06K 7/082; G08G 1/042; G01R 27/26; G01R 27/2611; G01R 27/267; G01R 1/06; G01R 1/067; G01R 31/31901

USPC .............................. 324/551, 555, 654, 76.75
See application file for complete search history.

(56) References Cited

U.S. PATENT DOCUMENTS

| | | | | |
|---|---|---|---|---|
| 4,878,553 A | * | 11/1989 | Yamanami | G06F 3/046 178/18.07 |
| 6,801,192 B2 | * | 10/2004 | Fujitsuka | G01D 5/2006 178/18.01 |
| 2005/0127893 A1 | * | 6/2005 | Matsubara | G06F 3/03545 324/76.67 |
| 2009/0315835 A1 | * | 12/2009 | De Goes | G06F 3/0416 345/173 |
| 2010/0238121 A1 | * | 9/2010 | Ely | G06F 3/044 345/173 |

* cited by examiner

*Primary Examiner* — Patrick Assouad
*Assistant Examiner* — Khristopher Yodichkas
(74) *Attorney, Agent, or Firm* — Seed IP Law Group LLP

(57) ABSTRACT

A coil detection circuit thereof for an electromagnetic input device including a plurality of first loop coils and second loop coils includes a first detection unit, a second detection unit and a selection unit. When the selection unit selects one the first loop coils to emit an electromagnetic signal for each one of the second loop coils, each one of the second loop coils forms a second closed loop for receiving the electromagnetic signal, and the second detection unit detects a second signal. When one of the second loop coils forms an open circuit or short circuit, the second detection unit detects an open-circuit signal or a short-circuit signal.

21 Claims, 3 Drawing Sheets

ELECTROMAGNETIC INPUT DEVICE AND COIL DETECTION CIRCUIT THEREOF

BACKGROUND

1. Technical Field

The present disclosure relates to an electromagnetic input device and a coil detection circuit thereof, in particular, to an electromagnetic input device having a plurality of loop coils, and a coil detection circuit thereof.

2. Description of Related Art

People can interact with electronic devices via an input device, such as a touch panel, wherein the touch panels with advances in technology, have been widely used in electronic devices, such as smart phones, tablet computers, auto teller machines (ATMs) or computer graphics tablets, etc. Thus, people can easily touch the touch panel to generate an input signal to an electronic device so as to enhance the ease of operation of the electronic device However, to enhance the touch sensing ability of the touch panel, the induction lines in touch panel are closely distributed in a certain area of the transparent conductive film, such as an indium tin oxide (ITO) film, or in a certain area of the metal pattern layer of a substrate. Because the induction lines are in a interlaced and tight distribution, an induction line shorting or opening condition may occur in the sensing circuit of the input device, and the ease of usage of the touch panel is thus reduced.

Moreover, a conventional detection device or coil detection circuit includes, for example, a voltage source and a plurality of indicator lights, so as to test the input device (such as the touch panel), wherein the voltage source is connected to one terminal of each induction line, and each of the indicator lights is correspondingly connected between another terminal of the corresponding induction line and a common ground terminal. If an induction line opening condition occurs, the indicator light connected to the corresponding induction line will not light up so that the operator can determine the corresponding induction line is in an open circuit state.

Although the conventional detection device can detect the induction line opening condition, the detection device neither can identify whether there is an induction line shorting condition occurs in the adjacent or interleaved induction lines nor identify whether the impedance of each of the induction lines falls within a specified range. If an induction line shorting condition occurs in one induction line and another induction line which is adjacent to or vertically staggered with respect to the induction line, the conventional detection device cannot detect the induction line shorting condition. For example, when one X-axis direction induction line connects with another X-axis direction induction line which is adjacent to the X-axis direction induction line (i.e. the induction line shorting condition occurs), the indicator light still lights up, but the induction line shorting condition should not exist in the touch panel.

In addition to the induction line shorting condition cannot be detected, whether the impedance of each of the induction lines is abnormally high or low cannot be identified either even the induction lines are determined to be normal under the induction line opening condition test. However, the impedance abnormality in the corresponding induction line will still affect the operation of the input device (such as the touch panel).

SUMMARY

An exemplary embodiment of the present disclosure provides an electromagnetic input device and a coil detection circuit thereof for identifying whether a plurality of adjacent or staggered loop coils have a short circuit defect or an open circuit defect or whether the resistance value of the loop coil falls within a reasonable range.

An exemplary embodiment of the present disclosure provides a coil detection circuit for electromagnetic input device comprising a plurality of first loop coils, a plurality of second loop coils, a first multiplex unit and a second multiplex unit. The first multiplex unit is coupled to the first loop coils, and the second multiplex unit is coupled to the second loop coils. The coil detection circuit of electromagnetic input device comprises a selection unit, a first detection unit and a second detection unit. The selection unit is coupled to the first multiplex unit and the second multiplex unit, and the first detection unit is coupled to the first multiplex unit; the second detection unit is coupled to the second multiplex unit. When the selection unit selects one of the first loop coils to emit a first electromagnetic signal to each one of the second loop coils, each one of the second loop coils forms a second closed loop for receiving the first electromagnetic signal. In a situation where the second loop coils are normal, each one of the second loop coils generates reasonable induced current and induced voltage due to the existence of the first electromagnetic signal, and then the second detection unit can detect the generation of the second signal. Accordingly, when one of the second loop coils does not form the second closed loop, the second detection unit cannot detect the reasonable induced current or induced voltage, and then identify such situation as an open circuit state. On the contrary, when one of the second loop coils forms a short circuit, the second detection unit can detect the appearance of the same induced current or induced voltage, and then identify such situation as a short circuit state. Similarly, when the selection unit selects one of the second loop coils to emit a second electromagnetic signal to each one of the first loop coils, each one of the first loop coils forms a first closed loop for receiving the second electromagnetic signal. In a situation where the first loop coils are normal, each one of the first loop coils generates reasonable induced current and induced voltage due to the existence of the second electromagnetic signal and then the first detection unit can detect the generation of a first signal. When one of the first loop coils does not form the first closed loop, the first detection unit detects an open-circuit signal; when one of the first loop coils forms a short circuit, the first detection unit detects a short-circuit signal.

An exemplary embodiment of the present disclosure provides an electromagnetic input device which comprises a plurality of first loop coils, a plurality of second loop coils, a first multiplex unit and, second multiplex unit, a selection unit, a control unit, a first transmission switch unit, a first detection unit, a second transmission switch unit and a second detection unit. The second loop coils and the first loop coils are in staggered arrangement. The first multiplex unit is coupled to the first loop coils. The second multiplex unit is coupled to the second loop coils. The selection unit is coupled to the first multiplex unit and the second multiplex unit. The control unit is coupled to the selection unit. The first transmission switch unit is coupled to the first multiplex unit and the control unit. The first detection unit is coupled to the first transmission switch unit and the control unit for detecting an electric property variation value of a first closed loop of each one of the first loop coils to identify a short circuit or an open circuit state. The second transmission switch unit is coupled to the second multiplex unit and the control unit. The second detection unit is coupled to the second transmission switch unit and the control unit for detecting an electric property variation value of a second closed loop of each one of the second loop coils to identify the short circuit or the open circuit state. When the selection unit selects one of the first loop coils to emit a first electromagnetic signal to each one of the second loop coils, each one of the second loop coils forms the closed loop for receiving the first electromagnetic signal and then the second detection unit detects a second signal; when one of the second loop coils does not form the second closed loop, the second detection unit detects an open-circuit signal; when one of the second loop coils forms a short circuit, the second detection unit detects a short-circuit signal. When the selection unit selects one of the second loop coil to emit a second electromagnetic signal to each one of the first loop coils, each one of the first loop coils forms the first closed loop for receiving the second electromagnetic signal and then the first detection unit detects a first signal; when one of the first loop coils does not form the first closed loop, the first detection unit detects the open-circuit signal; when one of the first loop coils forms the short circuit, the first detection unit detects the short-circuit signal.

The specific means of the present disclosure are as follows. One of first loop coils or one of the second loop coils is selected to be coupled to the selection unit. When the selection unit selects the one of the first loop coils (or one of the second loop coils) to emit an electromagnetic signal to each one of the second loop coils (or the first loop coils), each one of the second loop coils (or the first loop coils) forms a second closed loop (or a first closed loop) for receiving the electromagnetic signal and then the second detection unit (or the first detection unit) detects a second signal (or a first signal); when one of the second loop coils (or the first loop coils) forms an open circuit or a short circuit, the second detection unit (or the first detection unit) detects an open-circuit signal or a short-circuit signal. Therefore, compared to the prior art, the present disclosure can improve sensing accuracy of the electromagnetic input device, since the coil detection circuit can further detect whether a plurality of adjacent or staggered loop coils have a short circuit defect or an open circuit defect or whether the resistance value of the loop coil falls within a reasonable range.

In order to further understand the techniques, means and effects of the present disclosure, the following detailed descriptions and appended drawings are hereby referred, such that, through which, the purposes, features and aspects of the present disclosure can be thoroughly and concretely appreciated; however, the detailed descriptions and appended drawings are merely provided for reference and illustration, without any intention to be used for limiting the present disclosure.

DESCRIPTION OF THE EXEMPLARY EMBODIMENTS

Figure 1:
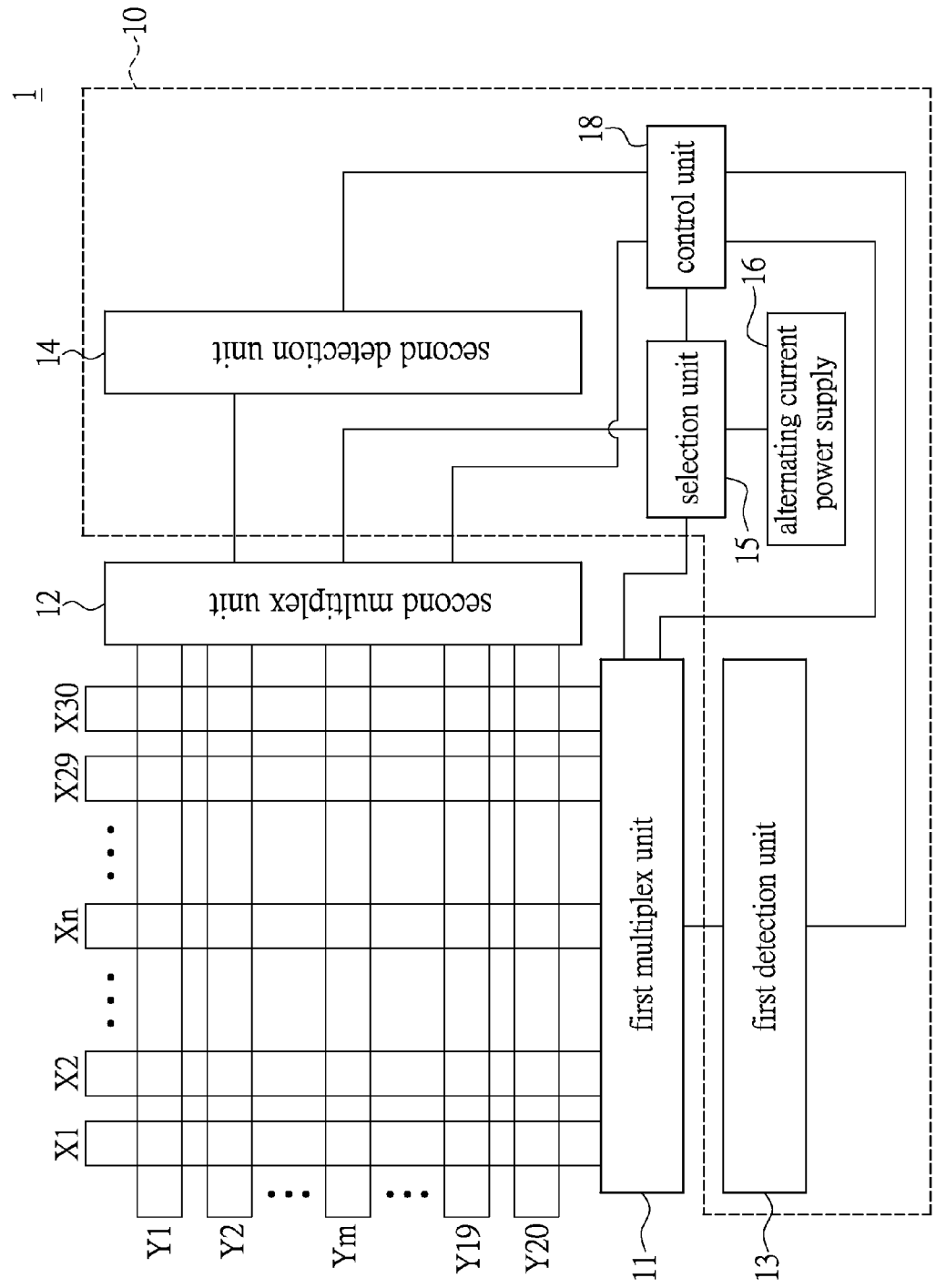
FIG. 1 is a functional block diagram of a coil detection circuit of an electromagnetic input device in an embodiment of the present disclosure.

FIG. 1 is a functional block diagram of a coil detection circuit of an electromagnetic input device in an embodiment of the present disclosure. Please refer to FIG. 1. An electromagnetic input device 1 comprises a plurality of first loop coils X1-X30, a plurality of second loop coils Y1-Y20, a coil detection circuit 10, a first multiplex unit 11 and second multiplex unit 12. In practice, the electromagnetic input device 1 is, for example, a computer graphics tablet, a computer handwriting tablet, a computer digital tablet or an electronic whiteboard; however, in the present disclosure, the electromagnetic input device 1 is not limited thereto.

For easy illustration, in the present embodiment, the first loop coils X1-X30 are an electromagnetic induction antenna loop in X-axis direction, and the second loop coils Y1-Y20 are an electromagnetic induction antenna loops in Y-axis direction. In another embodiment, the first loop coils X1-X30 can be an electromagnetic induction antenna loops in Y-axis direction or in other axis direction, and the second loop coils Y1-Y20 can be an electromagnetic induction antenna loops in X-axis direction or in other axis direction. The first loop coils X1-X30 and the second loop coils Y1-Y20 are in staggered arrangement in different bedding surface; the first and second loop coils X1-X30, Y1-Y20 are formed in a substrate to constitute an electromagnetic board and an induction plane of the electromagnetic induction antenna loops. In which, the staggered arrangement of the first or second loop coils X1-X30, Y1-Y20 are not limited to what shown in FIG. 1. In the present disclosure, the implementations of the first loop coils X1-X30 or the second loop coils Y1-Y20 are not limited.

Following that, in the present embodiment, the number of the first loop coils X1-X30 is 30 and the number of the second loop coils Y1-Y20 is 20 for illustration. In other embodiment, the number of the first loop coils X1-X30 or the second loop coils Y1-Y20 can be 600, 800, 1024 or other number. In the present disclosure, the number of the first loop coils X1-X30 or the second loop coils Y1-Y20 is not limited.

Furthermore, the first multiplex unit 11 is coupled to the first loop coils X1-X30; the second multiplex unit 12 is coupled to the second loop coils Y1-Y20. In practice, the multiplex unit is for example an analog switch, a selection circuit, or a switching circuit. A control unit 18 controls the first and second multiplex units 11, 12 sequentially to achieve full-field scanning in X-axis direction and Y-axis direction so as to sequentially receive the electromagnetic signals received by the first and second loop coils X1-X30, Y1-Y20. Therefore, the number of the switches is related to the first and second loop coils X1-X30, Y1-Y20.

The coil detection circuit 10 comprises, for example, a first detection unit 13, a second detection unit 14, a selection unit 15, an alternating current power supply 16, and a control unit 18. In practice, the coil detection circuit 10 is used for detecting whether the first and second loop coils X1-X30, Y1-Y20 have at least a short circuit defect or an open circuit defect. A conventional coil detection circuit (or a signal processing circuit) for an electromagnetic digital board comprises an amplifying circuit, a filtering circuit, a regulating circuit, an integrating circuit, a sampling circuit and other such complex circuit combination. Compared to the conventional coil detection circuit for an electromagnetic digital board, the coil detection circuit 10 does not comprise an amplifying circuit, a filtering circuit, a regulating circuit, an integrating circuit, and a sampling circuit; therefore, the present disclosure has a different technical feature in evidence.

In detail, the first detection unit 13 is coupled to the first multiplex unit 11; the second detection unit 14 is coupled to the second multiplex unit 12. The implementing method of the first and second detection units 13, 14 is, for example, taking the first loop coils X1-X30 connected to the first multiplex unit 11 to be the emitting coil for the conductive current, and taking the second loop coils Y1-Y20 connected to the second multiplex unit 12 to be the receiving coil for the induced electromotive force or induced current.

The first loop coils X1-X30 and the second loop coils Y1-Y20 are in a staggered arrangement with a very short distance; therefore, when the control unit 18 controls the alternating current power supply 16 to supply power to the first loop coils X1-X30, the surrounding magnetic flux will change significantly, and thus making the second loop coils Y1-Y20 generate a corresponding induced electromotive force or induced current immediately. As the distance between the two loop coils X1-X30, Y1-Y20 is very short, the induction efficiency is large; therefore, the induced current of the second loop coils Y1-Y20 can be measured without being processed by a special circuit (e.g., a gain amplifying circuit or a filtering circuit and so on). That is, the second detection unit 14 can directly measure the magnitude of the induced signal of the second loop coils Y1-Y20 connected to the second multiplex unit 12 so as to detect whether the second loop coils Y1-Y20 have the short circuit defect or the open circuit defect.

It is further described the difference between the first and second detection units 13, 14 and a conventional coil detection circuit (or a signal processing circuit) in an electromagnetic input device. The difference results from that the signal waveform to be processed is entirely different. The difference is: if the electromagnetic input device 1 is in a normal "writing scanning mode", the distance between the first and second loop coils X1-X30, Y1-Y20 and an electromagnetic pen is not fixed, and the signal can be received by the electromagnetic input device 1 from the electromagnetic pen is usually very small. As the amplitude of the signal rapidly decays and decreases, the signal from the electromagnetic pen can only be received during a short time period. Furthermore, the frequency of the electromagnetic pen is not fixed but changes, so the signal is getting weak once the electromagnetic pen is getting far from the loop coils X1-X30, Y1-Y20.

On the contrary, if the electromagnetic input device 1 is in a "coil checking mode", the distance between the second loop coils Y1-Y20 and the first loop coils X1-X30 is fixed and very close (because the two loop coils are respectively on the two different sides of the electromagnetic board). As the distance is very close and the alternating current power supply 16 provides larger current, the signal which can be received by the second loop coils Y1-Y20 is very stable. That is, the second detection unit 14 can receive the signal sent from one of the first loop coils X1-X30 to each one of the second loop coils Y1-Y20 during long time period. Not only the signal amplitude is fixed and relatively large, but the signal frequency is known in advance.

To summarize, it is can be seen that the signal waveform and the signal feature to be processed by the electromagnetic input device 1 in the "coil checking mode" are totally different from those in the "writing scanning mode".

Similarly, it can be seen that each of the second loop coils Y1-Y20 connected to the second multiplex unit 12 can be the emitting coil for the conductive current, and each of the first loop coils X1-X30 connected to the first multiplex unit 11 can be the receiving coil for the induced electromotive force or induced current, and the first detection unit 13 measures the magnitude of the induced signal each of the first loop coils X1-X30 so as to detect whether the first loop coils X1-X30 have the short circuit defect or the open circuit defect.

Therefore, the first and second detection units 13, 14 are apparently different from the conventional signal processing circuit (comprising an amplifying circuit, a filtering circuit, a regulating circuit, an integrating circuit, a sampling circuit) for an electromagnetic input device in circuit design.

Each of the first and second detection units 13, 14 can measure the signal without special processing, such that each of the first and second detection units 13, 14 primarily provide a fixed load in circuit design, wherein the composition structure of each of the first and second detection units 13, 14 can be a voltage dividing circuit composed of one or more resistors or capacitors, so that each of the first and second detection units 13, 14, or the control unit 18 can directly measure the signal.

Accordingly, the first and second detection units 13, 14 are different from the conventional signal processing circuit for the electromagnetic digital board in function and using method.

However, in the present disclosure, the first and second detection units 13, 14 can be combined or collocated with an amplifying circuit, a filtering circuit, an integrating circuit, and a sampling circuit in application to achieve the purpose of more accurate sampling. The composition structure of the first and second detection units 13, 14, an amplifying circuit, a filtering circuit, an integrating circuit, and a sampling circuit is not limited in the present disclosure either.

In practice, the first and second detection units 13, 14 are used to get the induced signals of each of the first loop coils X1-X30 and each of the second loop coils Y1-Y20, and the first and second detection units 13, 14 measure the induced signal of the first and second loop coils X1-X30, Y1-Y20 so as to detect a short circuit defect or an open circuit defect in the first loop coils X1-X30 or the second loop coils Y1-Y20.

The selection unit 15 is coupled to the control unit 18, the first multiplex unit 11, and the second multiplex unit 12. In practice, the selection unit 15 is also coupled to the first multiplex unit 11 and the second multiplex unit 12 in parallel so as to select one of the first loop coils X1-X30 or one of the second loop coils Y1-Y20 to couple to the alternating current power supply 16, and then the alternating current power supply 16 emits an electromagnetic signal to one the loop coils X1-X30 and Y1-Y20. The selection unit 15 can be implemented by a switching circuit. In other embodiments, the selection unit 15 can only be coupled to the first multiplex unit 11 (or the second multiplex unit 12) to select one of the first loop coils X1-X30 (or the second loop coils Y1-Y20) so as to detect a short circuit defect or an open circuit defect in the second loop coils Y1-Y20 (or in the first loop coils X1-X30). The implementation of the selection unit 15 is not limited in the present disclosure.

The alternating current power supply 16 is coupled to the selection unit 15, wherein the first loop coil Xn is coupled to the selection unit 15 via the first multiplex unit 11, the second loop coil Ym is coupled to the selection unit 15 via the second multiplex unit 12, n is an integer from 1 through 30 in the embodiment, and m is an integer from 1 through 20 in the embodiment.

When the selection unit 15 selects the first loop coil Xn, the alternating current power supply 16 and the first loop coil Xn will form a closed loop and the closed loop generates an electromagnetic flux by the alternating current power supply 16 so as to emit a first electromagnetic signal to the second loop coils Y1-Y20. Similarly, we can know that when the alternating current power supply 16 and the second loop coil Ym form a closed loop, which will emit a second electromagnetic signal to the first loop coils X1-X30.

Next, the control unit 18 is coupled to the selection unit 15, the first and second multiplex units 11, 12. The control unit 18 is used for controlling the selection unit 15 to select using the first loop coil Xn or the second loop coil Ym to emit the electromagnetic signal.

In general, the electromagnetic input device 1 has a liquid crystal display screen with a plurality of loop coils forming an electromagnetic board with function-specific integrated circuit, and an electromagnetic pen (not shown). In the normal "writing scanning mode", when the electromagnetic pen (not shown) contacts the liquid crystal display screen, the magnetic field will change. The signal is processed by the signal processing circuit of the electromagnetic input device 1 (comprising an amplifying circuit, a filtering circuit, a regulating circuit, an integrating circuit, and a sampling circuit) and then transmitted to the control unit 18 so as to calculate the coordinate of the contact point. The control unit 18 can control the first and second loop coils X1-X30, Y1-Y20 to transmit electromagnetic wave energy to an electromagnetic pen (not shown). The control unit 18 switches the first and second loop coils X1-X30, Y1-Y20 to receive the electromagnetic wave energy transmitted by from the electromagnetic pen (not shown) and to emit corresponding electromagnetic wave energy to the electromagnetic pen (not shown).

In the "coil checking mode", the control unit 18 controls the switching of the first and second loop coils X1-X30, Y1-Y20 to transmit or receive electromagnetic wave energy. When the control unit 18 controls the switching of the first or second loop coils X1-X30, Y1-Y20 to receive electromagnetic wave energy, the control unit 18 can control the selection unit 15 to select the first loop coil Xn or the second loop coil Ym to emit the electromagnetic signal. For example, the selection unit 15 selects the first loop coil Xn to emit the first electromagnetic signal to each one of the second loop coils Y1-Y20, and then the second detection unit 14 is used to detect the short circuit defect or the open circuit defect in the each one of the second loop coils Y1-Y20. Or alternatively, the selection unit 15 selects the second loop coil Ym to emit the second electromagnetic signal to each one of the first loop coils X1-X30, and then the first detection unit 13 is used to detect the short circuit defect or the open circuit defect in the each one of the first loop coils X1-X30.

In detail, when the selection unit 15 selects the first loop coil Xn to emit the first electromagnetic signal to the each one of the second loop coils Y1-Y20, if one of the second loop coils Y1-Y20 forms a closed loop, the second detection unit 14 detects a second signal; if one of the second loop coils Y1-Y20 does not form a closed loop, the second detection unit 14 detects an open-circuit signal; if one of the second loop coils Y1-Y20 forms a short circuit, the second detection unit 14 detects a short-circuit signal.

When the selection unit 15 selects the second loop coil Ym to emit the second electromagnetic signal to the each one of the first loop coils X1-X30, if one of the first loop coils X1-X30 forms a closed loop, the first detection unit 13 detects a first signal; if one of the first loop coils X1-X30 does not form a closed loop, the first detection unit 13 detects the open-circuit signal; if one of the first loop coils X1-X30 forms a short circuit, the first detection unit 13 detects the short-circuit signal.

For example, the first signal or the second signal is a current signal or a voltage signal which indicates that the corresponding one of the first coils X1-X30 or corresponding one of the second loop coils Y1-Y20 is in a normal condition; the open-circuit signal is a signal which indicates that the current of the corresponding one of the first coils X1-X30 or corresponding one of the second loop coils Y1-Y20 is smaller than the current indicated by the first or second signal; the short-circuit signal is a signal which indicates that the voltage of the corresponding one of the first coils X1-X30 or corresponding one of the second loop coils Y1-Y20 is lower than the voltage indicated by the first or second signal. The implementation of operation for detecting a normal state, a short circuit state or an open circuit state of each of the first and second loop coils X1-X30, Y1-Y20 by the first and second detection units 13, 14 is not limited in the present disclosure.

An example is given as follows. When a user want to detect a short circuit or an open circuit state for each of the first loop coils X1-X30, the control unit 18 controls the selection unit 15 to couple to a second loop coil Y10 so as to make the second loop coil Y10 to emit a second electromagnetic signal to the each one of the first loop coils X1-X30. When each one of the first loop coils X1-X30 forms a closed loop, each one of the first loop coils X1-X30 generates an induced current or an induced voltage as a first signal according to the second electromagnetic signal. The first signal indicates the voltage value, the current value or the resistance value when each one of the first loop coils X1-X30 forms the closed loop. It is known from that when each one of the first loop coils X1-X30 does not form a closed loop, for one example, each one of the first loop coils X1-X30 forms an open circuit, an induced current will not be generated; for another example, when each one of the first loop coils X1-X30 forms a short circuit, an induced voltage will not be generated. Accordingly, the short circuit or the open circuit state for each one of the first loop coils X1-X30 can be identified.

Similarly we can see that when a user wants to detect a short circuit or an open circuit state for each of the second loop coils Y1-Y20, the control unit 18 controls the selection unit 15 to couple to a first loop coil X15 so as to make the first loop coil X15 to emit a first electromagnetic signal to the each one of the second loop coils Y1-Y20. When each one of the second loop coils Y1-Y20 forms a closed loop, each one of the first loop coils X1-X30 respectively generates an induced current or an induced voltage as a second signal. That is, the second signal indicates the voltage value, the current value or the resistance value when each one of the second loop coils Y1-Y20 forms the closed loop. After that, the control unit 18 compares the received induced voltage, the received induced current or the resistance value of each of the second coils Y1-Y20 with a reasonable range to see if the received induced voltage, the received induced current or the resistance value of each of the second coils Y1-Y20 falls within the reasonable range so as to identify whether each of the second loop coils Y1-Y20 has the short circuit or the open circuit state or whether the impedance of each of the second loop coils Y1-Y20 falls within a specified range.

It is worth mentioning that when the control unit 18 controls the selection unit 15 to make the first loop coil Xn emit the first electromagnetic signal, the alternating current power supply 16 and the first loop coil Xn form a closed loop; similarly, when the control unit 18 controls the selection unit 15 to make the second loop coil Ym to emit the second electromagnetic signal, the alternating current power supply 16 and the second loop coil Ym form a closed loop.

In addition, in the present embodiment, the first loop coil Xn is used to emit the first electromagnetic signal, such that the short circuit defect or the open circuit defect in each of the second loop coils Y1-Y20 can be detected. The first loop coil Xn is in the middle position of the first loop coils X1-X30 so that the second loop coils Y1-Y20 can receive the electromagnetic signal. In another one embodiment, the first loop coil Xn can be the first loop coil X1, the first loop coil X8, or the first loop coil X30. The positions of the first loop coil Xn and the second loop coil Ym are not limited in the present disclosure.

An operation of the coil detection circuit 10 in the electromagnetic input device 1 will be further illustrated by the following description.

Figure 2:
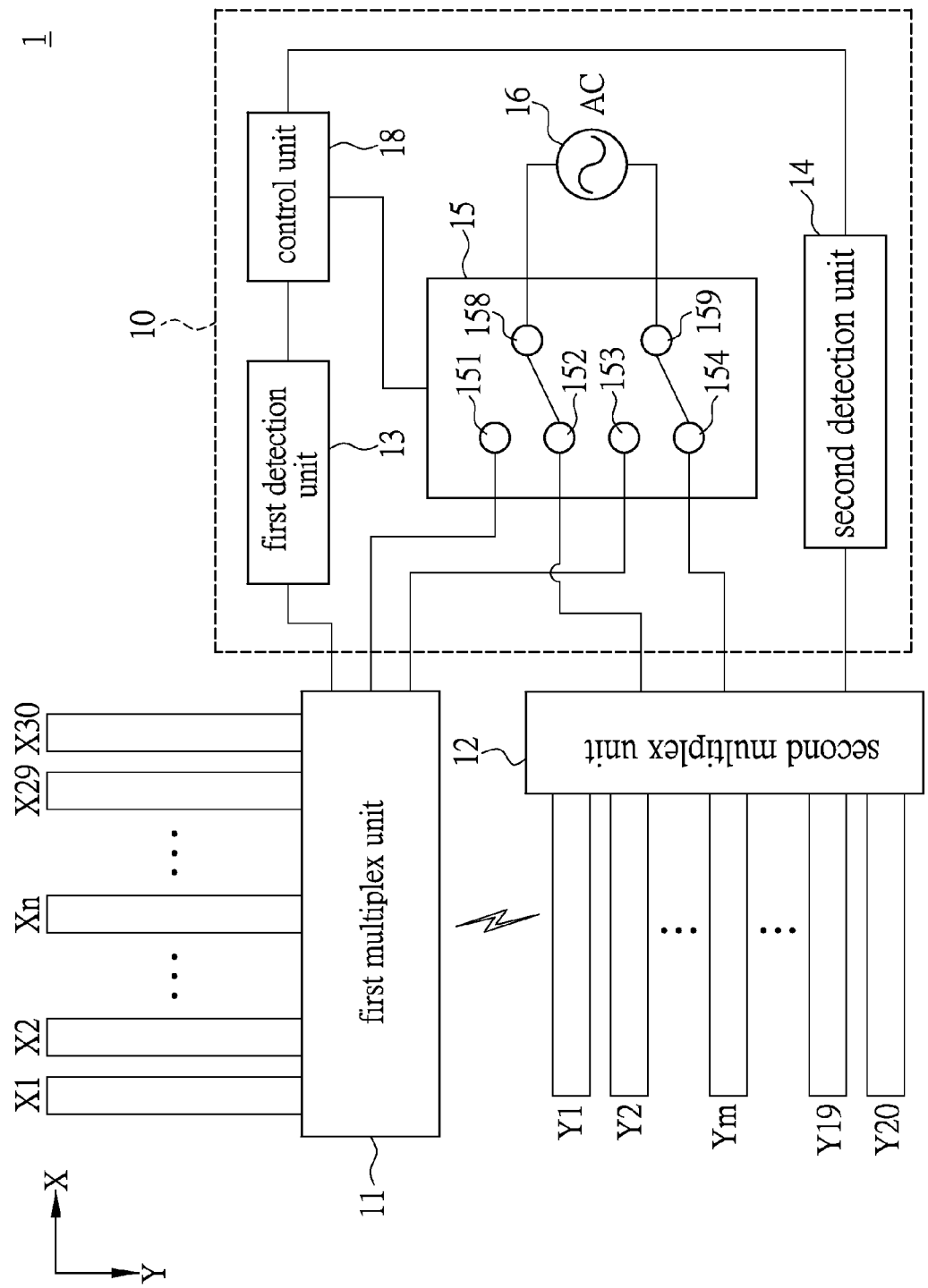
FIG. 2 is a circuit diagram of a coil detection circuit of electromagnetic input device in another embodiment of the present disclosure according to FIG. 1.

FIG. 2 is a circuit diagram of a coil detection circuit of electromagnetic input device in another embodiment of the present disclosure according to FIG. 1. Please refer to FIG. 2. In the present embodiment, the selection unit 15 comprises a first terminal 151, a second terminal 152, a third terminal 153, a forth terminal 154, a first common terminal 158, and a second common terminal 159. The first terminal 151 and the third terminal 153 are coupled to the first loop coil Xn through the first multiplex unit 11; the second terminal 152 and the forth terminal 154 are coupled to the second loop coil Ym through the second multiplex unit 12; the first common terminal 158 and the second common terminal 159 are coupled to the alternating current power supply 16, as shown in FIG. 2.

When the control unit 18 controls the selection unit 15 to couple to the first loop coil Xn, for example, when the selection unit 15 makes the first common terminal 158 and the first terminal 151 in the selection unit 15 be conducted and the second common terminal 159 and the third terminal 153 be conducted via the switching circuit of the selection unit 15, the first loop coil Xn and the alternating current power supply 16 will thereby form a closed loop, so the first loop coil Xn generates a magnetic flux to emit the first electromagnetic signal to the each one of the second loop coils Y1-Y20.

Similarly, we can see that when the control unit 18 controls the selection unit 15 to couple to the second loop coil Ym, for example, when the selection unit 15 makes the first common terminal 158 and the second terminal 152 in the selection unit 15 be conducted and the second common terminal 159 and the forth terminal 154 be conducted via the switching circuit of the selection unit 15, the second loop coil Ym and the alternating current power supply 16 will thereby form a closed loop, so the second loop coil Ym generates a magnetic flux to emit the second electromagnetic signal to the each one of the first loop coils X1-X30. The implementation of operation of the coil detection circuit 10 is not limited in the present disclosure.

It is worth mentioning that, in other embodiments, the selection unit 15 can further comprise a fifth terminal (not shown), a sixth terminal (not shown), a seventh terminal (not shown) and an eighth terminal (not shown). In which, the fifth terminal (not shown) and the sixth terminal (not shown) are, for example, cut-off nodes; therefore, the controls unit 18 can control the first common terminal 158 and the second common terminal 159 of the selection unit 15 to couple to the cut-off nodes so as to disable the operation of the selection unit 15. Or alternatively, the seventh terminal (not shown) and the eighth terminal (not shown) are coupled to, for example, other multiplex units, such as the other multiplex units in a solid axis direction or other axis direction. The implementation of the selection unit 15 is not limited in the present disclosure.

Figure 3:
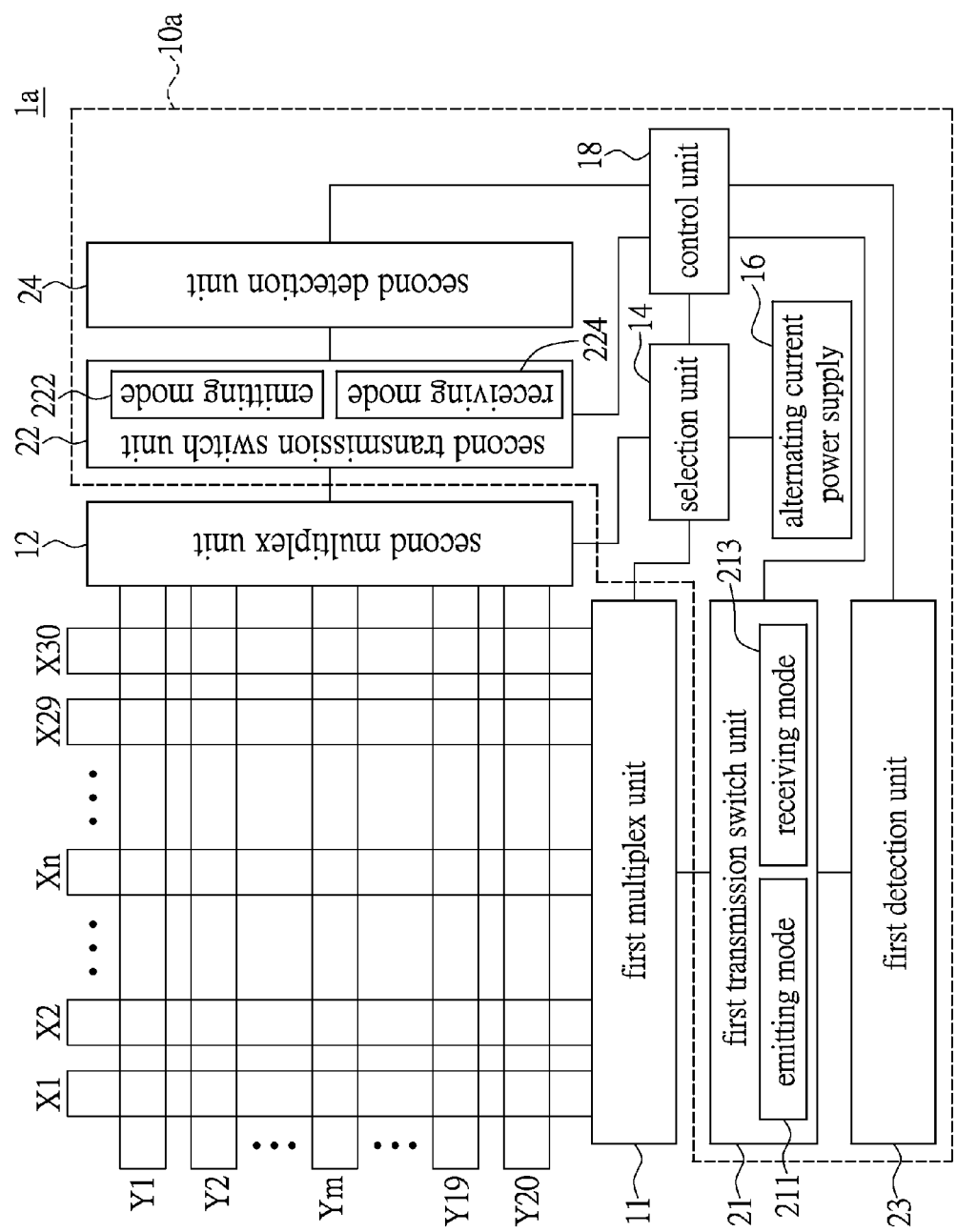
FIG. 3 is a functional block diagram of a coil detection circuit of an electromagnetic input device in another embodiment of the present disclosure.

FIG. 3 is a functional block diagram of a coil detection circuit of an electromagnetic input device in another embodiment of the present disclosure. Please refer to FIG. 3. An electromagnetic input device 1a in the present embodiment is similar to the electromagnetic input device 1 in the above embodiment. For example, a coil detection circuit 10a of the electromagnetic input device 1a also can select the first loop coil Xn (or the second loop coil Ym) via the selection unit 15 to make the alternating current power supply 16 and the first loop coil Xn (or the second loop coil Ym) form a closed loop to emit the electromagnetic signal to the second loop coils Y1-Y20 (or the first loop coils X1-X30) so as to identify a short circuit defect or an open circuit defect in each of the second loop coils Y1-Y20 (or in each of the first loop coils X1-X30). However, there is still a difference between the electromagnetic input device 1a and the electromagnetic input device 1. The difference is: the coil detection circuit 10a of the electromagnetic input device 1a further comprises a first transmission switch unit 21 and a second transmission switch unit 22. The implementation of the coil detection circuit 10a of the electromagnetic input device 1a is not limited in the present disclosure.

The first transmission switch unit 21 is coupled to the control unit 18, the first multiplex unit 11, and a first detection unit 23. The first transmission switch unit 21 is switched to a receiving modes 213, 224 to make the each one of the first loop coils X1-X30 forms a closed loop so as to receive the second electromagnetic signal. The first detection unit 23 is used for detecting electric property variation value of the closed loop of the each one of the first loop coils X1-X30 to identify the short circuit or the open circuit state.

Similarly we can see that the second transmission switch unit 22 is coupled to the control unit 18, the second multiplex unit 12, and a second detection unit 24. The second transmission switch unit 22 is switched to receiving modes 213, 224 to make the each one of the second loop coils Y1-Y20 forms a closed loop so as to receive the first electromagnetic signal. The second detection unit 24 is used for detecting electric property variation value of the closed loop of the each one of the second loop coils Y1-Y20 to identify the short circuit or the open circuit state.

In general, the first transmission switch unit 21 and the second transmission switch unit 22 both comprise emitting modes 211, 222 and receiving modes 213, 224. The first and second loop coils X1-X30, Y1-Y20 on the electromagnetic board form the electromagnetic induction antenna loop (i.e. the loop coils X1-X30, Y1-Y20) are respectively connected to the first and second multiplex units 11, 12, and the control unit 18 controls the first and second loop coils X1-X30, Y1-Y20 via the first and second transmission switch units 21, 22 to transmit and receive the electromagnetic signals.

For example, the electromagnetic input device 1a uses the first and second loop coils X1-X30, Y1-Y20 which are originally used for receiving electromagnetic wave energy to emit electromagnetic wave energy to the electromagnetic pen (not shown). The operation of such electromagnetic input device 1a is described as follows. When detecting the position of the electromagnetic pen (not shown) every time, some the first and second loop coils X1-X30, Y1-Y20 closest to the electromagnetic pen (not shown) can be used to emit the electromagnetic wave energy for approximately ten periods, then some of the first and second loop coils X1-X30, Y1-Y20 are stopped emitting electromagnetic wave energy, and the first transmission switch unit 21 and the second transmission switch unit 22 changes to the receiving modes 213, 224 respectively. Moreover, since the electromagnetic wave energy of the electromagnetic pen (not shown) runs out quickly, the receiving modes 213, 224 can only last for approximately ten periods, and the first transmission switch unit 21 and the second transmission switch unit 22 have to change to the emitting modes 211, 222 in the next round, such that the first and second loop coils X1-X30 and Y1-Y20 can emit the electromagnetic wave energy to the electromagnetic pen in the next round. Thus, the control unit 18 can control the first and second transmission switch units 21, 22 to switch to the emitting modes 211, 222 or the receiving modes 213, 224. The implementations of operations of the first and second transmission switch units 21, 22 are not limited in the present disclosure.

It is worth mentioning that the electromagnetic input device 1a can further comprise a display unit (not shown). The display unit (not shown) is, for example, coupled to the control unit 18; the display unit (not shown) can be implemented by, for example, an LCD display, an LED indicator light or other displays. In practice, when the first and second detection unit 23, 24 identify the normal state, the short circuit state, or the open circuit state of each the first and second loop coils X1-X30, Y1-Y20, and output the first, second, short circuit, or open circuit signal to the control unit 18, the control unit 18 can control the display unit (not shown) to display the electric property variation value of each of the first and second loop coils X1-X30, Y1-Y20 so as to display the normal state, short circuit state, or open circuit state of each of the first and second loop coils X1-X30, Y1-Y20.

Besides, in other embodiments, the display unit (not shown) is coupled to the first and second detection unit 23, 24 so that the display unit (not shown) displays the normal state, short circuit state, or open circuit state of each of the first and second loop coils X1-X30, Y1-Y20 according to the first, second, short circuit or open circuit signal. The coupling position of the display unit (not shown) is not limited in the present disclosure. Furthermore, the coil detection circuit 10a of the electromagnetic input device 1a exists in an implementation of, for example, an encapsulated circuit chip, a metal pattern layer substrate, or a detecting device, and the implementation of the electromagnetic input device 1a is not limited in the present disclosure. Except the above-mentioned differences, the other details should be easily known from the above-mentioned embodiments and the above-mentioned differences by those skilled in the art, and thus will not be further described herein.

In summary, the present disclosure provides an electromagnetic input device and a coil detection circuit thereof. In the present disclosure, one of the first loop coils or the one of the second loop coils is selected to be coupled to the selection unit; when the selection unit selects one of the first loop coils (or one the second loop coils) to emit the electromagnetic signal to the each one of the second loop coils (or each one of the first loop coils), the each one of the second loop coils (or each one of the first loop coils) forms a closed loop to receive the electromagnetic signal and then the second detection unit (or the first detection unit) detects a second signal (or a first signal); when one of the second loop coils (or the first loop coils) forms an open circuit or a short circuit, the second detection unit (or the first detection unit) detects an open-circuit signal or a short-circuit signal. Therefore, compared to the prior art, the present disclosure can improve sensing accuracy of the electromagnetic input device, since the coil detection circuit can further detect whether a plurality of adjacent or staggered loop coils have a short circuit defect or an open circuit defect or whether the resistance value of the loop coil falls within a reasonable range.

The above-mentioned descriptions represent merely the exemplary embodiment of the present disclosure, without any intention to limit the scope of the present disclosure thereto.

What is claimed is:

1. A coil detection circuit of an electromagnetic input device including a first plurality of loop coils, a second plurality of loop coils, a first multiplex unit, and a second multiplex unit, the first multiplex unit being coupled to the first plurality of loop coils, the second multiplex unit being coupled to the second plurality of loop coils, the coil detection circuit configured to detect an open-circuit condition or a short-circuit condition of each of the second plurality of loop coils in a first checking mode and detect an open-circuit condition or a short-circuit condition of each of the first plurality of loop coils in a second checking mode, and the coil detection circuit comprising:

a selection unit coupled to the first multiplex unit and the second multiplex unit, wherein:
the selection unit is configured to electrically couple a first loop coil of the first plurality of loop coils to a power supply in the first checking mode, the first loop coil configured to emit a first electromagnetic signal to each of the second plurality of loop coils in response to the first loop coil being electrically coupled to the power supply, each of the second plurality of loop coils configured to receive the first electromagnetic signal from the first loop coil in the first checking mode, each of the second plurality of loop coils configured to generate an electrical signal in response to receiving the first electromagnetic signal; and
the selection unit is configured to electrically couple a second loop coil of the second plurality of loop coils to the power supply in the second checking mode, the second loop coil configured to emit a second electromagnetic signal to each of the first plurality of loop coils in response to the second loop coil being electrically coupled to the power supply, each of the first plurality of loop coils configured to receive the second electromagnetic signal from the second loop coil in the second checking mode, each of the first plurality of loop coils configured to generate an electrical signal in response to receiving the second electromagnetic signal;

a first detection unit coupled to the first multiplex unit, the first detection unit configured to measure the electrical signal generated by each of the first plurality of loop coils in the second checking mode and configured to detect the open-circuit condition or the short-circuit condition of each of the first plurality of loop coils based on the measurement of the electrical signal of each of the first plurality of loop coils in the second checking mode; and a second detection unit coupled to the second multiplex unit, the second detection unit configured to measure the electrical signal generated by each of the second plurality of loop coils in the first checking mode and configured to detect the open-circuit condition or the short-circuit condition of each of the second plurality of loop coils based on the measurement of the electrical signal generated by each of the second plurality of loop coils in the second checking mode.

2. The coil detection circuit according to claim 1, further comprising a control unit coupled to the selection unit, wherein the power supply is an alternating current power supply, and the control unit is used for controlling the selection unit to select the first loop coil and the second loop coil for emitting the first electromagnetic signal and the second electromagnetic signal, respectively.

3. The coil detection circuit according to claim 2, wherein when the control unit controls the selection unit to make the first loop coil emit the first electromagnetic signal, the selected first loop coil and the power supply form a closed loop.

4. The coil detection circuit according to claim 2, wherein when the control unit controls the selection unit to make the second loop coil emit the second electromagnetic signal, the selected second loop coil and the power supply form a closed loop.

5. The coil detection circuit according to claim 3, wherein when the control unit controls the selection unit to make the second loop coil emit the second electromagnetic signal, the selected second loop coil and the power supply form another closed loop.

6. The coil detection circuit according to claim 2, wherein the first detection unit is used for detecting an electric property variation value of each of the first plurality of loop coils to identify the short-circuit condition or the open-circuit condition of each of the first plurality of loop coils for the control unit, and the second detection unit is used for detecting an electric property variation value of each of the second plurality of loop coils to identify the short-circuit condition or the open-circuit condition of each of the second plurality of loop coils for the control unit.

7. The coil detection circuit according to claim 6, further comprising a first transmission switch unit, wherein the first transmission switch unit is coupled between the first multiplex unit and the first detection unit, when the control unit controls the first transmission switch unit to switch to a receiving mode, each of the first plurality of loop coils forms a first closed loop for receiving the second electromagnetic signal, and the first detection unit is used for detecting an electric property variation value of the first closed loop of each of the first plurality of loop coils to identify the short-circuit condition or the open-circuit condition of each of the first plurality of loop coils.

8. The coil detection circuit according to claim 6, further comprising a second transmission switch unit, wherein the second transmission switch unit is coupled between the second multiplex unit and the second detection unit, when the control unit controls the second transmission switch unit to switch to a receiving mode, each of the second plurality of loop coils forms a second closed loop for receiving the first electromagnetic signal, and the second detection unit is used for detecting an electric property variation value of the second closed loop of each of the second plurality of loop coils to identify the short-circuit condition or the open-circuit condition of each of the second plurality of loop coils.

9. The coil detection circuit according to claim 7, further comprising a second transmission switch unit, wherein the second transmission switch unit is coupled between the second multiplex unit and the second detection unit, when the control unit controls the second transmission switch unit to switch to a receiving mode, each of the second plurality of loop coils forms a second closed loop for receiving the first electromagnetic signal, and the second detection unit is used for detecting an electric property variation value of the second closed loop of each of the second plurality of loop coils to identify the short-circuit condition or the open-circuit condition of each of the second plurality of loop coils.

10. The coil detection circuit according to claim 2, wherein the selection unit is a switching circuit including a first terminal, a second terminal, a third terminal, a fourth terminal, a first common terminal, and a second common terminal, the first terminal and the third terminal are coupled to the selected first loop coil via the first multiplex unit, the second terminal and the fourth terminal are coupled to the selected second loop coil via the second multiplex unit, and the first common terminal and the second common terminal are coupled to the power supply.

11. The coil detection circuit according to claim 1, further comprising a display unit, the display unit configured to display a normal state, a short-circuit condition, or an open-circuit condition of each of the first plurality of loop coils, and display a normal state, an open-circuit condition, or a short-circuit condition of each of the second plurality of loop coils.

12. An electromagnetic input device, comprising:
a first plurality of loop coils;
a second plurality of loop coils, the second plurality of loop coils and the first plurality of loop coils are in staggered arrangement;
a first multiplex unit coupled to the first plurality of loop coils;
a second multiplex unit coupled to the second plurality of loop coils;
a coil detection circuit configured to identify a short circuit or an open circuit state of each of the first plurality of loop coils in a first detection mode, the coil detection circuit including:
an alternating current power supply;
a selection unit coupled to the first multiplex unit and the second multiplex unit, the selection unit configured to electrically couple a first loop coil of the second plurality of loop coils to the alternating current power supply in the first detection mode, the first loop coil configured to emit a first electromagnetic signal to each of the first plurality of loop coils in response to the first loop coil being electrically coupled to the alternating current power supply;
a control unit coupled to the selection unit;
a first transmission switch unit coupled to the first multiplex unit and the control unit, the first transmission switch unit configured to set each of the first plurality of loop coils to form a closed loop and receive the first electromagnetic signal from the first loop coil in the first detection mode, each of the first plurality of loop coils configured to generate an electrical property variation in response to receiving the first electromagnetic signal; and
a first detection unit coupled to the first transmission switch unit and the control unit, the first detection unit configured to detect the electric property variation value of each of the first plurality of loop coils in the first detection mode and configured to identify the short circuit or the open circuit state of each of the first plurality of loop coils based on the detected electric property variation value of each of the first plurality of loop coils in the first detection mode.

13. The electromagnetic input device according to claim 12, wherein the first detection unit detects the open circuit state for a loop coil of the first plurality of loop coils in response to the loop coil of the first plurality of loop coils not forming a closed loop.

14. The electromagnetic input device according to claim 12, wherein the coil detection unit is configured to identify a short circuit or an open circuit state of each of the second plurality of loop coils in a second detection mode, the selection unit is configured to electrically couple a second loop coil of the first plurality of loop coils to the alternating current power supply in the second detection mode, the second loop coil configured to emit a second electromagnetic signal to each of the second plurality of loop coils in response to the first loop coil being electrically coupled to the alternating current power supply.

15. The electromagnetic input device according to claim 14, further comprising:
   a second transmission switch unit coupled to the second multiplex unit and the control unit, the second transmission switch unit configured to make each of the second plurality of loop coils form a closed loop and receive the second electromagnetic signal from the second loop coil in the second detection mode, each of the second plurality of loop coils configured to generate an electrical property variation in response to receiving the second electromagnetic signal; and
   a second detection unit coupled to the second transmission switch unit and the control unit, the second detection unit configured to detect the electric property variation value of each of the second plurality of loop coils in the second detection mode, the second detection unit configured to identify the short circuit or the open circuit state of each of the second plurality of loop coils based on the detected electric property variation value of each of the second plurality of loop coils.

16. The coil detection circuit according to claim 1, wherein the first detection unit detects an open-circuit condition in response to one of the first plurality of loop coils not forming a closed loop and detects a short-circuit condition in response to one of the first plurality of loop coils forming a short-circuit, and the second detection unit detects an open-circuit condition in response to one of the second plurality of loop coils not forming a closed loop and detects a short-circuit condition in response to one of the second plurality of loop coils forming a short-circuit.

17. A method, comprising:
   selecting, by a coil detection circuit, a first coil of a first set of coils to transmit a first electromagnetic signal and a second set of coils to receive the first electromagnetic signal in a first detection mode, the coil detection circuit determining whether each of the second set of coils has an open-circuit condition or a short-circuit condition in the first detection mode, the first set of coils extending in a first direction, the second set of coils overlapping the first set of coils and extending in a second direction perpendicular to the first direction;
   coupling, by the coil detection circuit, the first coil to an alternating current power supply in the first detection mode;
   emitting the first electromagnetic signal from the first coil in response to the coupling of the first coil to the alternating current power supply;
   receiving, by each of a second set of coils, the first electromagnetic signal from the first coil the first electromagnetic signal generating an electrical signal in each of the second set of coils;
   measuring, by the coil detection circuit, the electrical signal in each of the second set of coils in the first detection mode; and
   determining, by the coil detection circuit, whether each of the second set of coils has the open-circuit condition or the short-circuit condition based on the electrical signal in each of the second set of coils in the first detection mode.

18. The method of claim 17, further comprising:
   selecting, by the coil detection circuit, a second coil of the second set of coils to transmit a second electromagnetic signal and the first set of coils to receive the second electromagnetic signal in a second detection mode, the coil detection circuit determining whether each of the first set of coils has an open-circuit condition or a short-circuit condition in the second detection mode;
   coupling, by the coil detection circuit, the second coil to the alternating current power supply in the second detection mode;
   emitting the second electromagnetic signal from the second coil in response to the coupling of the second coil to the alternating current power supply;
   receiving, by each of the first set of coils, the second electromagnetic signal, the second electromagnetic signal generating an electrical signal in each of the first set of coils;
   measuring, by the coil detection circuit, the electrical signal in each of the first set of coils in the second detection mode; and
   determining, by the coil detection circuit, whether each of the first set of coils has the open-circuit condition or the short-circuit condition based on the electrical signal in each of the first set of coils in the second detection mode.

19. The method of claim 17, further comprising determining that a second coil of the second set of coils has an open-circuit condition in response to determining that an electric current of the second coil is below a threshold.

20. The method of claim 17, further comprising determining that a second coil of the second set of coils has a short-circuit condition in response to determining that a voltage of the second coil is below a threshold.

21. The method of claim 17, wherein the first coil is selected based on the first coil's position relative to other coils of the first set of coils.

* * * * *

UNITED STATES PATENT AND TRADEMARK OFFICE
CERTIFICATE OF CORRECTION

PATENT NO. : 9,778,777 B2
APPLICATION NO. : 14/066314
DATED : October 3, 2017
INVENTOR(S) : Chia-Jui Yeh It is certified that error appears in the above-identified patent and that said Letters Patent is hereby corrected as shown below:

In the Claims

Column 15, Lines 22-23 Claim 15:
"detection unit configured to identify the short circuit or the open circuit state of each" should read, --detection unit configured to identify the short-circuit or the open-circuit state of each--.

Column 16, Line 2 Claim 16:
"electromagnetic signal from the first coil the first electromagnetic" should read, --electromagnetic signal from the first coil, the first electromagnetic--.

Signed and Sealed this
Twentieth Day of February, 2018

Andrei Iancu
*Director of the United States Patent and Trademark Office*